United States Patent
Shao et al.

(10) Patent No.: US 12,183,540 B2
(45) Date of Patent: Dec. 31, 2024

(54) SYSTEMS AND METHODS OF DETERMINING ABERRATIONS IN IMAGES OBTAINED BY A CHARGED-PARTICLE BEAM TOOL

(71) Applicant: ASML NETHERLANDS B.V., Veldhoven (NL)

(72) Inventors: Yifeng Shao, Delft (NL); Maikel Robert Goosen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 262 days.

(21) Appl. No.: 17/726,421

(22) Filed: Apr. 21, 2022

(65) Prior Publication Data

US 2022/0328282 A1    Oct. 13, 2022

Related U.S. Application Data

(63) Continuation of application No. PCT/EP2020/075902, filed on Sep. 16, 2020.

(30) Foreign Application Priority Data

Oct. 22, 2019 (EP) .................................... 19204524
Mar. 23, 2020 (EP) .................................... 20165029

(51) Int. Cl.
*H01J 37/22* (2006.01)
*H01J 37/153* (2006.01)
(Continued)

(52) U.S. Cl.
CPC .......... *H01J 37/222* (2013.01); *H01J 37/153* (2013.01); *H01J 37/244* (2013.01); *H01J 37/28* (2013.01);
(Continued)

(58) Field of Classification Search
CPC .. H01J 37/00; H01J 37/02; H01J 37/22; H01J 37/222; H01J 37/153; H01J 37/244;
(Continued)

(56) References Cited

U.S. PATENT DOCUMENTS

2009/0268969 A1    10/2009  Thust et al.
2011/0272578 A1*   11/2011  Hirose .................... H01J 37/28
                                                                    250/311

FOREIGN PATENT DOCUMENTS

CN    101421823 A    4/2009
CN    103681188 A    3/2014
(Continued)

OTHER PUBLICATIONS

Kenji Nakahira "A New Image Restoration Technique for SEM" Proceedings of the 17th international federation of automatic control world congress, vol. 8189.

(Continued)

*Primary Examiner* — Jason L McCormack
(74) *Attorney, Agent, or Firm* — Finnegan, Henderson, Farabow, Garrett & Dunner, LLP

(57) ABSTRACT

A method of determining aberrations in images obtained by a charged-particle beam tool, comprising: a) obtaining two or more images of a sample, wherein each image is obtained at a known relative difference in a measurement condition of the charged-particle beam tool; b) selecting an estimated aberration parameter for the aberrations of a probe profile representing the charged-particle beam used by the charged-particle beam tool; c) evaluating an error function indicative of the difference between the two or more images and two or more estimated images that are a function of the estimated aberration parameter and the known relative difference in the measurement condition; d) updating the estimated aberration parameter; e) performing processes c) and d) iteratively; f) determining the final aberration parameter as the (Continued)

estimated aberration parameter that provides the smallest value of the error function.

17 Claims, 6 Drawing Sheets

(51) Int. Cl.
*H01J 37/244* (2006.01)
*H01J 37/28* (2006.01)

(52) U.S. Cl.
CPC .......... *H01J 2237/1532* (2013.01); *H01J 2237/1534* (2013.01); *H01J 2237/221* (2013.01); *H01J 2237/2803* (2013.01); *H01J 2237/2809* (2013.01)

(58) Field of Classification Search
CPC .... H01J 37/26; H01J 37/28; H01J 2237/1532; H01J 2237/1534; H01J 2237/221; H01J 2237/2803; H01J 2237/2809; H01J 2237/216
USPC .......................... 250/306, 307, 311
See application file for complete search history.

(56) References Cited

FOREIGN PATENT DOCUMENTS

| | | |
|---|---|---|
| EP | 2328168 A1 | 6/2011 |
| EP | 2704177 A1 | 3/2014 |
| JP | 2008288024 A | 11/2008 |
| TW | 201923814 A | 6/2019 |
| WO | WO 2015/015985 A1 | 2/2015 |

OTHER PUBLICATIONS

Office Action issued by the Intellectual Property Office (IPO) in related ROC (Taiwan) Patent Application No. 109135096, mailed Aug. 10, 2021 (14 pgs.).

Office Action issued by the Intellectual Property Office (IPO) in related ROC (Taiwan) Patent Application No. 109135096, mailed Jan. 5, 2022 (12 pgs.).

International Search Report and Written Opinion received from the International Search Authority issued in related International Application No. PCT/EP2020/075902, mailed Jan. 18, 2021 (6 pgs.).

* cited by examiner

SYSTEMS AND METHODS OF DETERMINING ABERRATIONS IN IMAGES OBTAINED BY A CHARGED-PARTICLE BEAM TOOL

CROSS-REFERENCE TO RELATED APPLICATIONS

This application claims priority to International Application No. PCT/EP2020/075902, filed Sep. 16, 2020, and published as WO 2021/078445 A1, which claims priority of EP application 19204524.3 which was filed on Oct. 22, 2019, and EP application 20165029.8 which was filed on Mar. 23, 2020. The contents of these applications are incorporated herein by reference in their entireties.

TECHNICAL FIELD

The embodiments of the present disclosure relate to a charged-particle beam tool, a method of determining aberrations in images obtained by a charged-particle beam tool, and a method of determining a setting of a charged-particle beam tool.

BACKGROUND

When manufacturing semiconductor integrated circuit (IC) chips, pattern defects and/or contaminant particles (residuals) inevitably appear on a wafer and/or a mask during fabrication processes, thereby reducing the yield to a great degree. For example, contaminant particles may be troublesome for patterns with smaller critical feature dimensions, which have been adopted to meet the more and more advanced performance requirements of IC chips.

Pattern inspection tools using a charged-particle beam, such as an electron beam, have been used to detect the defects and/or contaminant particles. These tools typically employ a scanning electron microscope (SEM) or other charged-particle beam tool. In the SEM, a beam of primary electrons having a relatively high energy is decelerated to land on a sample at a relatively low landing energy and is focused to form a probe spot thereon. Due to this focused probe spot of primary electrons, secondary electrons will be generated from the surface. By scanning the probe spot over the sample surface and collecting the secondary electrons, pattern inspection tools may obtain an image of the sample surface. Aberrations in the profile of the probe spot may reduce the spatial resolution of the image.

SUMMARY

The embodiments of the present disclosure relate to a charged-particle beam tool, a method of determining aberrations in images obtained from a charged-particle beam tool, and a method of determining a setting of a charged-particle beam tool.

According to an aspect of the present disclosure, there is provided a method of determining aberrations in images obtained by a charged-particle beam tool, the method comprising the steps of: a) obtaining two or more images of a sample using the charged-particle beam tool, wherein each image is obtained at a known relative difference in a measurement condition of the charged-particle beam tool; b) selecting an estimated aberration parameter for the aberrations of a probe profile representing the charged-particle beam used by the charged-particle beam tool; c) evaluating an error function indicative of the difference between the two or more images and two or more estimated images that are a function of the estimated aberration parameter and the known relative difference in the measurement condition; d) updating the estimated aberration parameter; e) performing steps c) and d) iteratively; and f) determining the final aberration parameter as the estimated aberration parameter that provides the smallest value of the error function.

According to another aspect of the present disclosure, there is provided a method of determining a setting of the charged-particle beam tool, the method comprising: performing the method of determining aberrations in images obtained by a charged-particle beam tool two or more times, each time based on a different estimate for the setting of the charged-particle beam tool, determining a residual error for each estimate of the setting by evaluating the error function based on the final aberration parameter determined for the respective estimate of the setting, and determining as the setting of the charged-particle beam tool the estimate of the setting resulting in the smallest residual error.

According to another aspect of the present disclosure, there is provided a method of determining aberrations in images obtained by a multi-beam charged-particle beam tool, the method comprising performing the method of determining aberrations for a first beamlet of the multi-beam charged-particle tool, wherein the estimated aberration parameter comprises a plurality of estimated aberration values, thereby determining a final aberration parameter comprising a plurality of final aberration values for the first beamlet; performing the method of determining aberrations for each of one or more further beamlets of the multi-beam charged-particle tool, wherein the step of selecting the estimated aberration parameter comprises selecting one or more final aberration values determined for the first beamlet as corresponding one or more estimated aberration values for each one or more further beamlet, and wherein the step of updating the estimated aberration parameter comprises updating estimated aberration values that do not correspond to the one or more estimated aberration values that were selected to correspond to the one or more final aberration values determined for the first beamlet.

According to another aspect of the present disclosure, there is provided a charged-particle beam tool comprising an illumination system configured to generate a charged-particle beam and scan the charged-particle beam across a sample, a detection system configured to capture charged particles interacting with the sample, thereby creating an image of the sample, and a controller configured to perform the method.

According to another aspect of the present disclosure, there is provided a computer program product comprising instructions which, when the program is executed by a computer, cause the computer to carry out the method.

According to another aspect of the present disclosure, there is provided a computer-readable storage medium comprising instructions which, when executed by a computer, cause the computer to carry out the method.

BRIEF DESCRIPTION OF THE DRAWINGS

Embodiments of the present disclosure will now be described, by way of example only, with reference to the accompanying schematic drawings in which corresponding reference symbols indicate corresponding parts, and in which.

DETAILED DESCRIPTION

Figure 1:
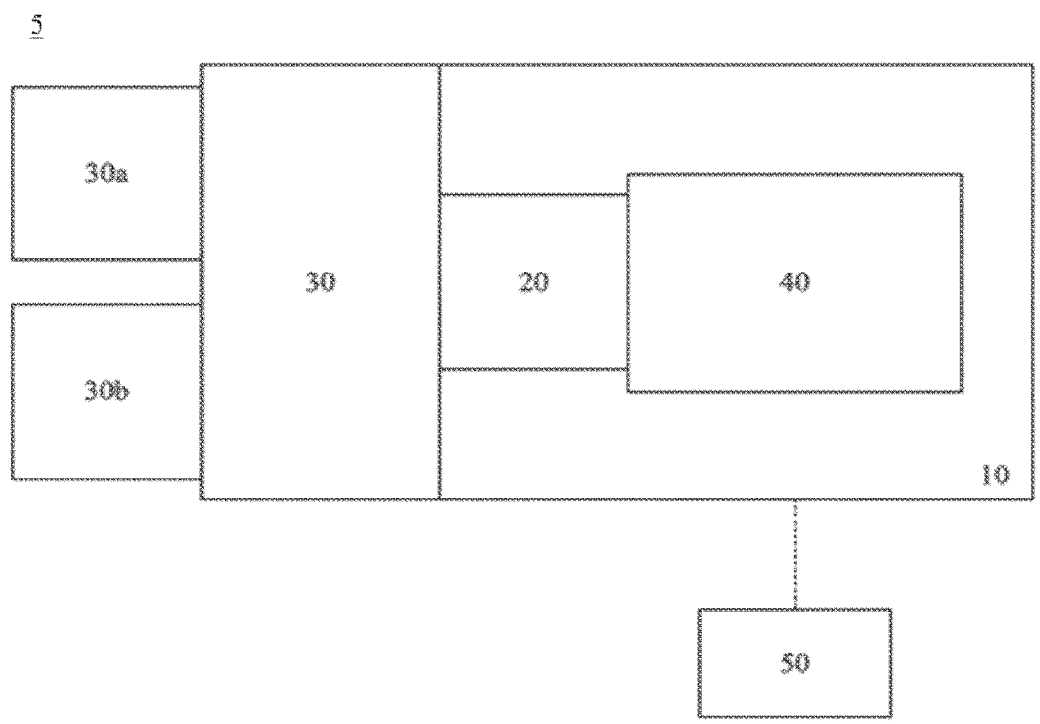
FIG. 1 is a schematic illustration of an exemplary charged-particle beam system.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

The enhanced computing power of electronic devices, while reducing the physical size of the devices, can be accomplished by significantly increasing the packing density of circuit components such as transistors, capacitors, diodes, etc. on an IC chip. For example, an IC chip of a smart phone, which is the size of a thumbnail, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get to a 75% yield, each individual step must have a yield greater than 99.4%, and if the individual step yield is 95%, the overall process yield drops to 7%.

While high process-yield is desirable in an IC chip manufacturing facility, maintaining a high substrate (i.e. wafer) throughput, defined as the number of substrates processed per hour, is also important. High process-yield and high substrate throughput can be impacted by the presence of defects, especially if operator intervention is required for reviewing the defects. Thus, high throughput detection and identification of micro and nano-sized defects by a charged-particle beam tool (such as an electron beam tool, in particular an SEM) is essential for maintaining high yield and low cost.

An electron beam tool, such as an electron beam inspection tool, comprises an illumination system that generates and scans a sample, such as a substrate, with one or more focused beams of primary electrons. The primary electrons interact with the sample and generate secondary electrons. The electron beam tool also comprises a detection system. By capturing the secondary electrons from the sample as the sample is scanned, the electron beam tool creates an image of the scanned area of the sample.

A known charged-particle beam tool, for example a charged-particle beam inspection tool, is described below.

Relative dimensions of components in drawings may be exaggerated for clarity. Within the following description of drawings the same or like reference numbers refer to the same or like components or entities, and only the differences with respect to the individual embodiments are described. As used herein, unless specifically stated otherwise, the term "or" encompasses all possible combinations, except where infeasible. For example, if it is stated that an apparatus can include A or B, then, unless specifically stated otherwise or infeasible, the apparatus can include A, or B, or A and B. As a second example, if it is stated that the apparatus can include A, B, or C, then, unless specifically stated otherwise or infeasible, the apparatus can include A, or B, or C, or A and B, or A and C, or B and C, or A and B and C.

Reference is now made to FIG. 1, which is a schematic diagram illustrating an exemplary charged-particle beam system 5. The charged-particle beam system 5 may be a charged-particle beam inspection system. The charged-particle beam system 5 may be an electron beam system 5, such as an electron beam inspection system 5. As shown in FIG. 1, charged-particle beam system 5 includes a main chamber 10, a load lock chamber 20, a charged-particle beam tool 40 (such as a charged-particle beam inspection tool 40), and an equipment front end module (EFEM) 30. Charged-particle beam tool 40 is located within main chamber 10. While the description and drawings are directed to an electron beam, it is appreciated that the embodiments are not used to limit the present disclosure to specific charged particles. Charged particles other than electrons could be used in the present disclosure.

EFEM 30 includes a first loading port 30*a* and a second loading port 30*b*. EFEM 30 may include additional loading port(s). First loading port 30*a* and second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 may be connected to a load lock vacuum pump system (not shown), which removes gas molecules in load lock chamber 20 to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown), which removes gas molecules in main chamber 10 to reach a second pressure below the first pressure. After reaching the second pressure, the sample is subject to inspection by charged-particle beam tool 40.

A controller 50 is electronically connected to charged-particle beam tool 40. Controller 50 may be a computer configured to execute various controls of charged-particle beam system 5. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure.

The charged-particle beam tool 40 may be a charged-particle beam inspection tool. The charged-particle beam tool 40 may be an electron beam tool 40, such as an electron beam inspection tool 40. The charged-particle beam tool 40 may comprise a single-beam tool. Alternatively, the charged-particle beam tool 40 may comprise a multi-beam tool. A multi-beam tool will be described with reference to FIG. 2 in the following, but it will be appreciated that the present disclosure is not limited to such a multi-beam tool, but may also be performed with a single-beam tool.

Figure 2:
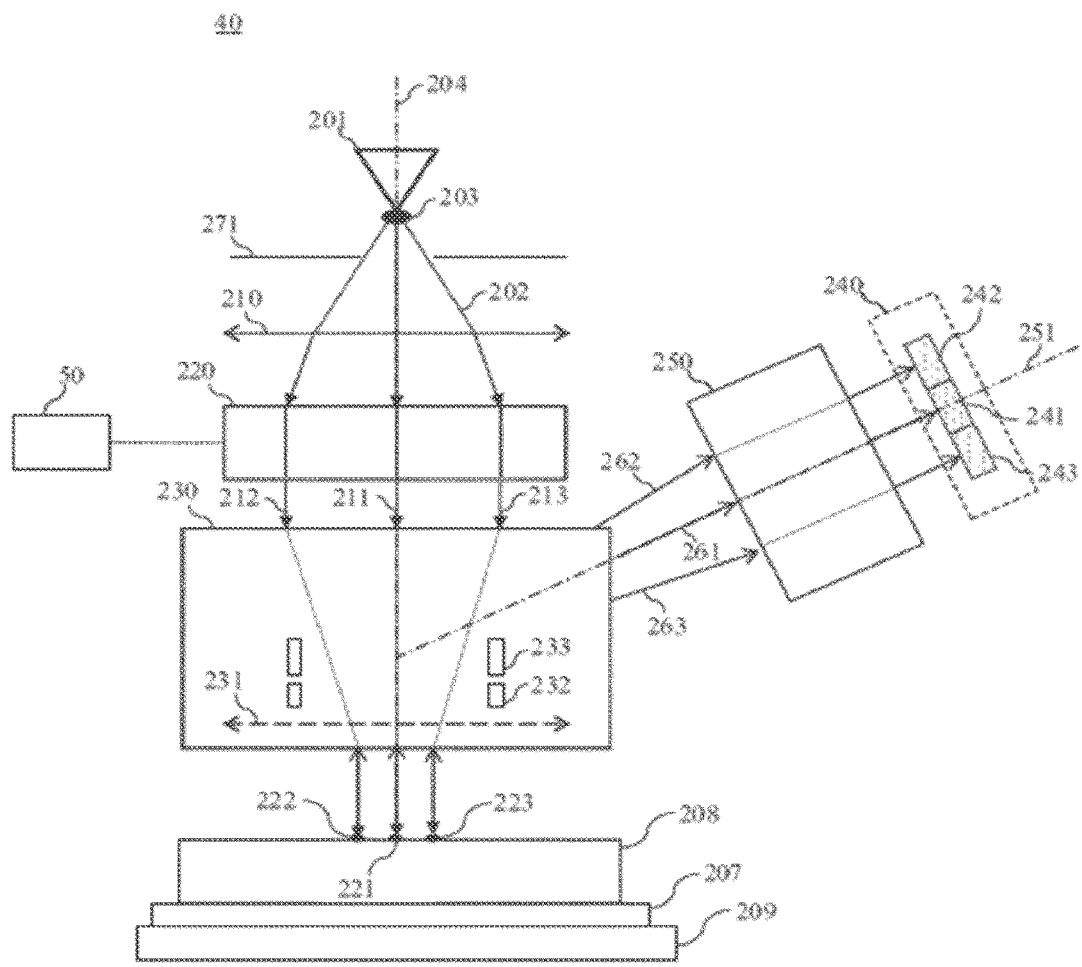
FIG. 2 is a schematic illustration of an exemplary charged-particle beam tool of a charged-particle beam system.

Reference is now made to FIG. 2, which is a schematic diagram illustrating an exemplary charged-particle beam tool 40, in particular an electron beam tool, including a multi-beam tool that is part of the exemplary charged-particle beam system 5 of FIG. 1. The charged-particle beam tool 40 may comprise a charged-particle source 201 (e.g. an electron source 201), a gun aperture plate 271, a condenser lens 210, a source conversion unit 220, a primary projection system 230, a motorized stage 209, and a sample holder 207 supported by the motorized stage 209 to hold a sample 208 (e.g., a sample or a photomask) to be inspected. The charged-particle beam tool 40 may further comprise a secondary projection system 250 and a detection device 240 (e.g. an electron detection device). The primary projection system 230 may comprise an objective lens 231. The detection device 240 may comprise a plurality of detection elements 241, 242, and 243. A beam separator 233 and a deflection scanning unit 232 may be positioned inside primary projection system 230.

The charged-particle source 201, the gun aperture plate 271, the condenser lens 210, the source conversion unit 220, the beam separator 233, the deflection scanning unit 232, and the primary projection system 230 may be aligned with a primary optical axis 204 of the charged-particle beam tool 40. The secondary projection system 250 and the detection device 240 may be aligned with a secondary optical axis 251 of the charged-particle beam tool 40.

The primary optical axis 204 is the optical axis of the part of the charged-particle beam tool 40 that is the illumination system. The secondary optical axis 251 is the optical axis of the part of the charged-particle beam tool 40 that is the detection system. The primary optical axis 204 may also be referred to herein as the primary electro-optical axis or charged-particle optical axis. The secondary optical axis 251 may also be referred to herein as the secondary electro-optical axis or the secondary charged-particle optical axis.

Charged-particle source 201 may be an electron source, and may comprise a cathode (not shown) and an extractor or anode (not shown), in which, during operation, charged-particle source 201 is configured to emit primary electrons or other charged particles from the cathode and the primary electrons or other charged particles are extracted or accelerated by the extractor and/or the anode to form a primary charged-particle beam 202, such as a primary electron beam 202, that forms a primary beam crossover (virtual or real) 203. Primary charged-particle beam 202 may be visualized as being emitted from primary beam crossover 203.

Source conversion unit 220 may comprise an image-forming element array, an aberration compensator array, a beam-limit aperture array, and a pre-bending micro-deflector array. The pre-bending micro-deflector array may deflect a plurality of primary beamlets 211, 212, 213 of primary charged-particle beam 202 to normally enter the beam-limit aperture array, the image-forming element array, and an aberration compensator array. Beamlets 211, 212, 213 are also referred to herein as sub-beams. The primary charged-particle beam 202 may comprise the plurality of primary beamlets 211, 212, 213. Condenser lens 210 may be designed to focus primary charged-particle beam 202 to become a parallel beam and be normally incident onto source conversion unit 220. The image-forming element array may comprise a plurality of micro-deflectors or micro-lenses to influence the plurality of primary beamlets 211, 212, 213 of primary electron beam 202 and to form a plurality of parallel images (virtual or real) of primary beam crossover 203, one for each of the primary beamlets 211, 212, 213. The aberration compensator array may comprise a field curvature compensator array (not shown) and an astigmatism compensator (i.e. stigmator) array (not shown). The field curvature compensator array may comprise a plurality of micro-lenses to compensate field curvature aberrations of the primary beamlets 211, 212, 213. The astigmatism compensator array may comprise a plurality of micro-stigmators to compensate astigmatism aberrations of the primary beamlets 211, 212, 213. The beam-limit aperture array may be configured to limit diameters of individual primary beamlets 211, 212, 213. FIG. 2 shows three primary beamlets 211, 212, 213 as an example, and it is appreciated that source conversion unit 220 may be configured to form any number of primary beamlets. Alternatively, a single charged-particle beam 202 may be provided, and the source conversion unit 220 may comprise a single image-forming element, a single aberration compensator (comprising a single field curvature compensator and a single astigmatism compensator), a single beam-limit aperture, and a single pre-bending micro-deflector. The controller 50 may be connected to various parts of charged-particle beam system 5 of FIG. 1, such as source conversion unit 220, electron detection device 240, primary projection system 230, or motorized stage 209. As explained in further details below, the controller 50 may perform various image and signal processing functions. The controller 50 may also generate various control signals to govern operations of the charged-particle beam system 5.

Condenser lens 210 is configured to focus primary charged-particle beam 202. Condenser lens 210 may further be configured to adjust electric currents of primary beamlets 211, 212, 213 downstream of source conversion unit 220 by varying the focusing power of the condenser lens 210. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be a movable condenser lens that may be configured so that the position of its first principle plane is movable. The movable condenser lens may be configured to be magnetic, which may result in off-axis beamlets 212 and 213 illuminating source conversion unit 220 with rotation angles. The rotation angles change with the focusing power or the position of the first principal plane of the movable condenser lens. Condenser lens 210 may be an anti-rotation condenser lens that may be configured to keep the rotation angles unchanged while the focusing power of condenser lens 210 is changed. Condenser lens 210 may be a movable anti-rotation condenser lens, in which the rotation angles do not change when its focusing power and the position of its first principal plane are varied.

The objective lens 231 may be configured to focus beamlets 211, 212, 213 onto a sample 208 for inspection and may form three probe spots 221, 222, 223 on the surface of sample 208. Alternatively, in a single-beam tool, the objective lens 231 may be configured to focus the primary charged-particle beam 202 onto the sample 208 and may form a single probe spot 221 on the surface of the sample 208. Gun aperture plate 271, in operation, is configured to block off peripheral electrons of primary electron beam 202 to reduce the Coulomb effect. The Coulomb effect may enlarge the size of each of probe spots 221, 222, 223 of primary beamlets 211, 212, 213, and therefore deteriorate inspection resolution. A gun aperture plate 271 may also be referred to as a coulomb aperture array.

Beam separator 233 may, for example, be a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual charged particles of primary beamlets 211, 212, 213 or primary charged-particle beam 202. The electrostatic force is equal in magnitude but opposite in direction to the magnetic force exerted by magnetic dipole field of beam separator 233 on the individual electrons. Primary beamlets 211, 212, 213 or primary charged-particle beam 202 may therefore pass at least substantially straight through beam separator 233 with at least substantially zero deflection angles.

Deflection scanning unit 232, in operation, is configured to deflect primary beamlets 211, 212, 213 to scan probe spots 221, 222, 223 across individual scanning areas in a section of the surface of the sample 208. In response to incidence of primary beamlets 211, 212, 213 or probe spots 221, 222, 223 on the sample 208, electrons emerge from the sample 208 and generate three secondary electron beams 261, 262, 263. Each of the secondary electron beams 261, 262, 263 typically comprises secondary electrons (having electron energy ≤50 eV) and backscattered electrons (having electron energy between 50 eV and the landing energy of primary beamlets 211, 212, 213). Beam separator 233 is configured to deflect secondary electron beams 261, 262, 263 towards secondary projection system 250. Secondary projection system 250 subsequently focuses secondary electron beams 261, 262, 263 onto detection elements 241, 242, 243 of electron detection device 240. Detection elements 241, 242, 243 are arranged to detect corresponding secondary electron beams 261, 262, and 263 and generate corresponding signals which are sent to controller 50 or a signal processing system (not shown), e.g. to construct images of the corresponding scanned areas of sample 208.

Detection elements 241, 242, 243 may detect corresponding secondary electron beams 261, 262, 263, respectively, and generate corresponding intensity signal outputs (not shown) to an image processing system (e.g., controller 50). Each detection element 241, 242, and 243 may comprise one or more pixels. The intensity signal output of a detection element may be a sum of signals generated by all the pixels within the detection element. In a single-beam tool, a single detection element 241 may be provided.

The controller 50 may comprise an image processing system that includes an image acquirer (not shown) and a storage device (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to detection device 240 of charged-particle beam tool 40 through a medium such as an electrical conductor, optical fiber cable, portable storage media, IR, Bluetooth, internet, wireless network, wireless radio, among others, or a combination thereof. The image acquirer may receive a signal from detection device 240 and may construct an image. The image acquirer may thus acquire images of the sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of the sample 208 sampled multiple times over a time sequence. The multiple images may be stored in the storage. The controller 50 may be configured to perform image processing steps with the multiple images of the same location of the sample 208.

The controller 50 may control motorized stage 209 to move sample 208 during inspection of sample 208. The controller 50 may enable motorized stage 209 to move sample 208 in a direction continuously at a constant speed. The controller 50 may enable motorized stage 209 to change the speed of the movement of sample 208 overtime depending on the steps of scanning process.

Although FIG. 2 shows that the charged-particle beam tool 40 uses three primary electron beams, the charged-particle beam tool 40 may use two or more primary electron beams. The charged-particle beam tool 40 may also use a single primary charged-particle beam 202 instead of beamlets 211, 212, 213. The present disclosure does not limit the number of primary electron beams used in charged-particle beam tool 40.

The charged-particle beam tool 40, in particular, the electron beam tool 40, may create an image of the sample 208. The image may be an image created by the primary charged-particle beam 202 of a single-beam tool or an image created by one of the beamlets 211, 212, 213 of a multi-beam tool. The created image comprises a contribution that is due to the secondary electrons emitted by the sample 208 (herein referred to as the object) and a contribution due to the shape or profile of the primary charged-particle beam 202 or of one of the beamlets 211, 212, 213 that is incident on the sample (herein referred to as the probe profile).

The image $I_z(r)$ in the z plane (i.e. the plane at distance z with respect to the plane of focus) may be expressed as the convolution of the object $O(r)$ and the probe profile $H_z(r; \zeta)$ in the z plane, i.e. as $$I_z(r) = O(r) * H_z(r; \zeta)$$

The probe profile $H_z(r; \zeta)$ is the shape or profile of the primary charged-particle beam 202 in the z plane in which the sample 208, or specifically the surface of the sample 208, is located, i.e. a plane orthogonal to the primary optical axis 204 and at a position z relative to the plane of focus of the objective lens 231 along the primary optical axis 204. In the plane of focus of the objective lens 231, z=0. The probe profile $H_z(r; \zeta)$ is dependent on the aberration $\zeta$ for a specific charged-particle wavelength $\lambda$ (which depends on the kinetic energy or landing energy of the charged particle) and the numerical aperture NA of the objective lens 231. In analogy to optics, the probe profile $H_z(r; \zeta)$ corresponds to the intensity of the point-spread function (PSF).

In the spatial frequency domain, $$\hat{I}_z(k) = \hat{O}(k) \times \hat{H}_z(k; \zeta),$$

where $\hat{I}_z(k)$ is the Fourier transform of the image $I_z(r)$, $\hat{O}(k)$ is the Fourier transform of the object $O(r)$, and $H_z(k; \zeta)$ is the Fourier transform of the probe profile $H_z(r; \zeta)$ and k is the spatial frequency component. As such, the Fourier transform of the image is the product of the Fourier transform of the object and the Fourier transform of the probe profile. In analogy to optics, the Fourier transform of the probe profile may also be referred to as the optical transfer function. In the following, the terms "Fourier transform of the object" and "object", "Fourier transform of the image" and "image" and "Fourier transform of the probe profile" and "probe profile" will be used interchangeably.

The wavefront of an ideal focused charged-particle beam is a perfect sphere that is centered at the point of focus in the plane of focus. In reality, the aberrations deform the probe profile so as to deviate from the ideal wavefront. As a result, the spatial resolution of the image $I_z(r)$ may be negatively affected, even when the sample 208 is in the plane of focus of the charged-particle beam tool 40. It is thus desirable to determine and remove or reduce the aberrations in the image $I_z(r)$, i.e. to determine and remove or reduce from the image $I_z(r)$ the contributions of the probe profile to the image $I_z(r)$ that are due to the aberrations.

Figure 3:
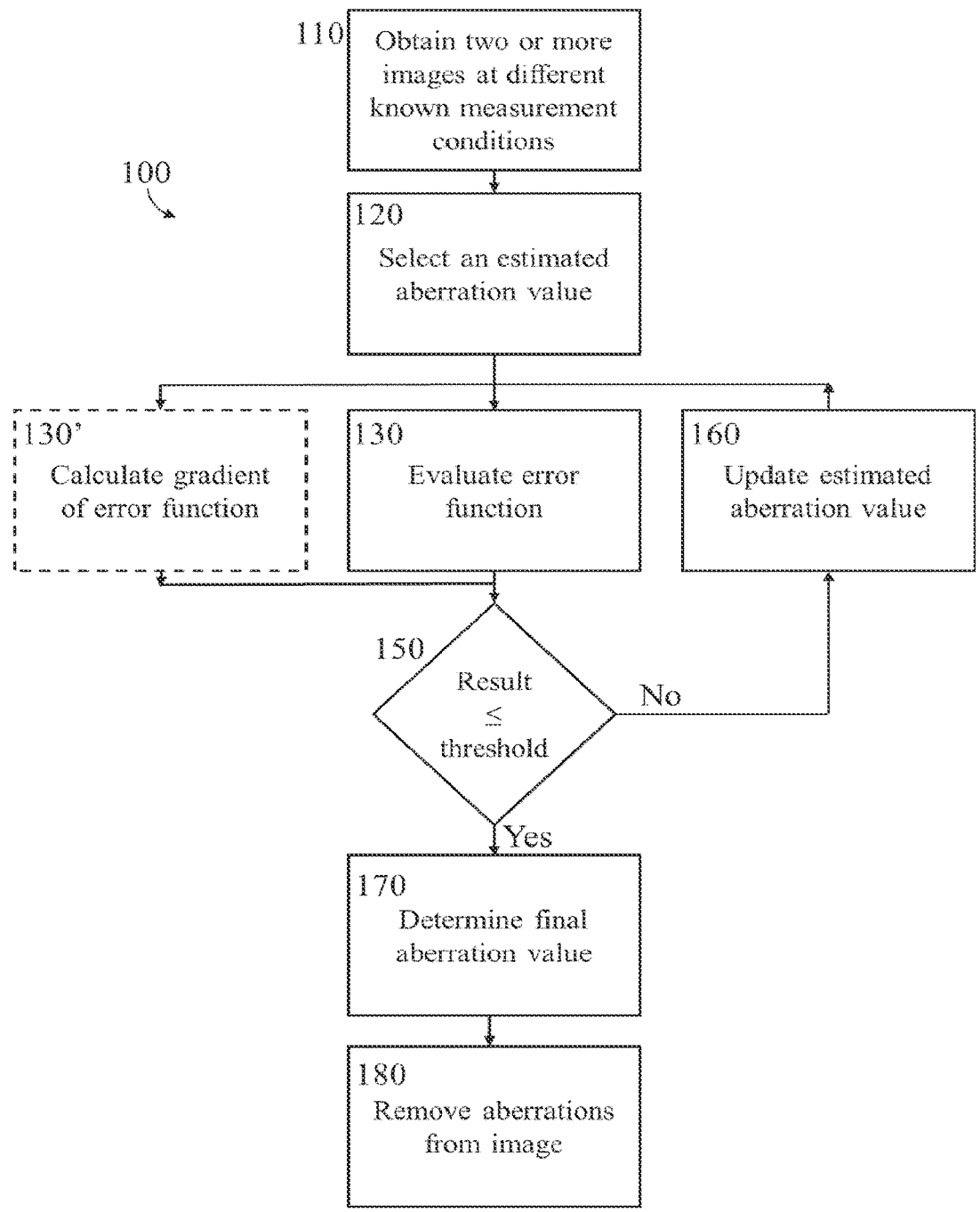
FIG. 3 illustrates a flowchart representing a method of determining aberrations in images obtained by a charged-particle beam tool of FIG. 2, consistent with embodiments of the present disclosure.

FIG. 3 shows an exemplary method 100 of determining aberrations in images obtained by the charged-particle beam tool 40, in accordance with some embodiments of the present disclosure. The image may be an image created by the primary charged-particle beam 202 of a single-beam tool or an image created by one of the beamlets 211, 212, 213 of a multi-beam tool. The aberrations in each beamlet 211, 212, 213 of a multi-beam tool may be different. If the aberrations for each beamlet 211, 212, 213 are relatively similar, then the aberrations determined for one of the beamlets 211, 212, 213 may be considered to correspond to the aberrations of the other beamlets 211, 212, 213. Alternatively, if the aberrations for each beamlet 211, 212, 213 are relatively different (e.g. in a multi-column charged-particle beam tool), then the method 100 may be performed for each of the beamlets 211, 212, 213 separately, so as to determine the respective aberrations for each of the beamlets 211, 212, 213. Further alternatively, if the aberrations for each beamlet 211, 212, 213 are or may be relatively different (e.g. in a multi-beam charged-particle beam tool in which the beamlets 211, 212, 213 share a common macro electro-optical element, for example when a single beam is split into multiple beams), then the method 100 may be performed for one of the beamlets 211, 212, 213, i.e. based on an image or images created by the one of the beamlets 211, 212, 213, and the method 100 may be performed again for one or more other beamlets 211, 212, 213 taking into account the aberrations determined for the one of the beamlets 211, 212, 213. When the beamlets 211, 212, 213 share a common macro electric-optical element, the aberrations in each beamlet 211, 212, 213 due to the common macro electric-optical element may be similar. However, taking into account the aberrations determined for one of the beamlets 211, 212, 213 in the determination of aberrations of other beamlets 211, 212, 213 may also be used when the beamlets 211, 212, 213 do not share a common macro electro-optical element. This is even though the aberrations in the beamlets 211, 212, 213 may be considered to be independent, for example in situations in which these independent aberrations are nonetheless relatively similar (e.g. because the individual electro-optical elements operate relatively similarly). Taking into account the aberrations determined for one of the beamlets 211, 212, 213 in the determination of aberrations of other beamlets 211, 212, 213 will be explained in more detail below.

The method 100 comprises a step 110 of obtaining two or more images of the sample 208 using the charged-particle beam tool 40. The two or more images are of the same sample 208. Each image is obtained at a known relative difference in a measurement condition of the charged-particle beam tool 40. In other words, a known phase diversity may be induced between the two or more images. The method 100 may comprise obtaining an image of the sample 208 at a first value of the measurement condition, adjusting the first value by a known difference in value of the measurement condition (i.e. in a known fashion) to a second value of the measurement condition, and obtaining an image of the sample 208 at the second value of the measurement condition. Optionally, the first and second values of the measurement condition may also be known. The method 100 may further comprise adjusting the value of the second measurement condition by one or more known relative differences to further values of the measurement condition, and obtaining an image of the sample 208 at each further value of the measurement condition. Optionally, the further values of the measurement conditions may also be known.

The measurement condition of the charged-particle beam tool 40 may comprise a position of the sample 208, in particular, of the surface of the sample 208, along the primary optical axis 204 relative to the plane of focus of the objective lens 231. Varying the position of the sample 208 relative to the plane of focus of the objective lens 231 may be one of several ways of inducing a known phase diversity between the two or more images. The position of the sample 208 along the primary optical axis 204 relative to the plane of focus of the objective lens 231 may be adjusted by adjusting the amount of focusing of the objective lens 231, so as to move the plane of focus of the objective lens 231. For this purpose, the charged-particle beam tool 40 may comprise the objective lens 231. Adjusting the amount of focusing of the objective lens 231 may affect the numerical aperture NA of the charged-particle tool 40. The effect of the varying numerical aperture on the images may, however, be negligible compared to the effect of the varying position of the plane of focus on the images.

Alternatively, or additionally, the position of the sample 208 along the primary optical axis 204 relative to the plane of focus of the objective lens 231 may be adjusted by moving the sample 208 in the direction along the primary optical axis 204. For this purpose, the charged-particle beam tool 40 may comprise the motorized stage 209 for adjusting the position of the sample 208 in the direction along the primary optical axis 204. Moving the sample 208 may not affect the numerical aperture NA of the charged-particle tool 40.

Alternatively, or additionally, the measurement condition of the charged-particle beam tool 40 may comprise an amount of beam shaping applied to the primary charged-particle beam 202 by the charged-particle beam tool 40. The amount of beam shaping may, for example, comprise an amount of aberration correction, such as an amount of field curvature compensation applied to the charged-particle beam 202 or an amount of astigmatism compensation applied to the charged-particle beam 202. For this purpose, the charged-particle beam tool 40 may comprise the aberration compensator or any other beam shaping element. The aberration compensator may comprise the field curvature compensator or the astigmatism compensator, or both. In an embodiment, the measurement condition of the charged-particle beam tool 40 is an amount of astigmatism applied to the charged-particle beam 202. Varying the amount of beam shaping, or specifically the amount of astigmatism, is an alternative way of inducing a known phase diversity between the two or more images in a controlled manner. This may be advantageous, for example, in situations in which it is difficult to know the exact position of the sample 208 along the primary optical axis 204 relative to the plane of focus of the objective lens 231, for example if the exact position of the plane of focus is difficult to determine. The amount of astigmatism may be adjusted using the astigmatism compensator or stigmator of the charged-particle beam tool 40. In an embodiment, the amount of beam shaping or specifically the amount of astigmatism may be varied while the sample 208 is deliberately out of focus, i.e. when the sample 208 is not in the plane of focus of the objective lens 231. This may magnify the effect of varying the amount of beam shaping or the amount of astigmatism.

Alternatively, or additionally, the measurement condition of the charged-particle beam tool 40 may comprise an average landing energy of the charged particles used in the charged-particle beam tool 40. The average landing energy of the charged particles may be adjusted, for example, by adjusting the operating conditions of the charged-particle source 201, such as the voltage applied to the extractor or the anode of the charged-particle source 201. For this purpose, the charged-particle beam tool 40 may comprise the charged-particle source 201. Additionally, or alternatively, the average landing energy of the charged particles may be adjusted by decelerating the charged particles between the objective lens 231 and the sample 208, for example by creating a suitable electric field between the objective lens 231 and the sample 208. For this purpose, the charged-particle beam tool 40 may comprise the objective lens 231.

The measurement condition may also comprise any combination of the measurement conditions provided above.

The method 100 further comprises a step 120 of selecting an estimated aberration parameter $\zeta$ for the aberrations of the probe profile representing the primary charged-particle beam 202. The estimated aberration parameter $\zeta$ may comprise one or more estimated aberration values (i.e. $\zeta=[\zeta_1, \zeta_2, \ldots]$), for example one estimated aberration value per Zernike polynomial that is used to account for the aberrations in the image. The estimated aberration parameter $\zeta$ may be a vector comprising or consisting of one or more estimated aberration values ($\zeta=[\zeta_1, \zeta_2, \ldots 1]$), preferably 15 or more estimated aberration values, further preferably 37 or more estimated aberration values. Selecting the estimated aberration parameter $\zeta$ may comprise selecting each of the estimated aberration values comprised by the estimated aberration parameter $\zeta$. Selecting the estimated aberration parameter $\zeta$ may comprise choosing or setting the estimated aberration parameter $\zeta$ to an initial guess or estimate for the actual aberration parameter. The initial guess or estimate may be predetermined. For example, the initial estimated aberration values may all be 0. Alternatively, the initial guess or estimate may be based on an estimated aberration parameter $\zeta$ that was determined earlier for the charged-particle beam tool 40, e.g. when the method 100 was last performed. Further alternatively, an operator of the charged-particle beam tool 40 may freely choose the initial guess or estimate.

The method 100 further comprises a step 130 of evaluating an error function. The error function is indicative of the difference between the two or more images and two or more estimated images. The two or more estimated images are a function of the estimated aberration parameter $\zeta$ and the known relative difference in the measurement condition. The two or more estimated images may be a function of the estimated aberration parameter $\zeta$ and the known value of the measurement condition. The two or more estimated images may further be based on settings of the charged-particle beam tool 40, such as the numerical aperture NA of the objective lens 231 and the wavelength of the charged particles. The settings of the charged-particle beam tool 40 may be at least approximately known.

The step 130 of evaluating the error function may comprise calculating an estimated probe profile for each image based on the estimated aberration parameter $\zeta$ and the known relative difference in the measurement condition. The estimated probe profile may be based on the estimated aberration parameter $\zeta$ and the known value of the measurement condition. The estimated probe profile may further be based on the settings of the charged-particle beam tool 40. The step 130 may further comprise calculating, for each image of the two or more images, the difference between the image and an estimated image that is based on the respective estimated probe profile, and summing the calculated differences.

For example, the two or more images may be represented in the spatial frequency domain as a set of linear equations:

$$\hat{I}_{z1}(k) = \hat{O}(k)\hat{H}_{z1}(k;\zeta)$$
$$\hat{I}_{z2}(k) = \hat{O}(k)\hat{H}_{z1}(k;\zeta)$$
$$\ldots \quad \ldots \quad \ldots$$
$$\hat{I}_{zn}(k) = \hat{O}(k)\hat{H}_{zn}(k;\zeta)$$

where $\hat{I}_{zn}(k)$ is a respective image, $\hat{O}(k)$ is the object and $\hat{H}_{zn}(k; \zeta)$ is a respective probe profile. The measurement condition differs by a known relative difference for each image. The object $\hat{O}(k)$ represents the contribution of the sample 208 to the image $\hat{I}_{zn}(k)$, and so is identical in each of the linear equations.

The set of linear equations can be solved for the object $\hat{O}(k)$ to provide a solution for $\hat{O}(k)$:

$$\hat{O}(k) = \frac{\sum_{k=1}^{zn} \hat{I}_z(k)\hat{H}_z(k;\zeta)^*}{\sum_{k=1}^{zn} |\hat{H}_z(k;\zeta)|^2}$$

where $\hat{H}_z(k; \zeta)^*$ represents the complex conjugate of $\hat{H}_z(k; \zeta)$.

The error function L ($\zeta$), which is indicative of the difference between the two or more images $\hat{I}_z(k)$ and two or more estimated images that are a function of the estimated aberration parameter and the known relative difference in the measurement condition (and optionally the known value of the measurement condition), may be expressed as:

$$L(\zeta) = \sum_z \int |\hat{I}_z(k) - \hat{O}(k)\hat{H}_z(k;\zeta)|^2 dk$$

where $\hat{I}_z(k)$ is a respective one of the two or more images in the plane at distance z with respect to the plane of focus, and the respective estimated image is calculated as $\hat{O}(k)\hat{H}_z(k; \zeta)$, where $\hat{H}_z(k; \zeta)$ is the respective estimated probe profile. Inserting the solution for Ô(k) and reordering the terms leads to the error function L(ζ):

$$L(\zeta) = \sum_z \int \left[ \frac{\left|\sum_k \hat{I}_z(k)\hat{H}_z(k;\zeta)^*\right|^2}{\sum_k |\hat{H}_z(k;\zeta)|^2} - \sum_k |\hat{I}_z(k)|^2 \right] dk$$

The method 100 may also comprise a step 130' of calculating a gradient L'(ζ) of the error function with respect to the aberration parameter ζ (where the aberration parameter ζ may be a vector $\zeta=[\zeta_1, \zeta_2, \ldots]$) based on the estimated aberration parameter ζ. The step 130' may be performed after step 130 of evaluating the error function L (ζ), or before step 130 of evaluating the error function L (ζ), or in parallel with step 130 of evaluating the error function L(ζ). The gradient L'(ζ) of the error function with respect to the aberration parameter ζ may be calculated as:

$$L'(\zeta) = \sum_z \int 2\Re \left\{ \frac{\left[\sum_k \hat{I}_z(k)\hat{H}_z(k;\zeta)^*\right]\left[\sum_k \hat{I}_z(k)^*\hat{H}'_z(k;\zeta)\right]}{\sum_k |\hat{H}_z(k;\zeta)|^2} - \frac{\left|\sum_k \hat{I}_z(k)\hat{H}_z(k;\zeta)^*\right|^2 \left[\sum_k \hat{H}_z(k;\zeta)^*\hat{H}'_z(k;\zeta)\right]}{\left(\sum_k |\hat{H}_z(k;\zeta)|^2\right)^2} \right\} dk$$

where $\Re$ represents the real part of the term in brackets, and $\hat{H}'_z(k; \zeta)$ represents the gradient of $\hat{H}_z(k; \zeta)$ with respect to the aberration parameter ζ.

The gradient L'(ζ) of the error function may be indicative of the difference between the two or more images and two or more estimated images that are a function of the estimated aberration parameter and the known relative difference in the measurement condition (optionally the known value of the measurement condition). The gradient L'(ζ) may also provide information for updating the estimated aberration parameter. The estimated aberration parameter may be updated until the value of the error function is sufficiently small or the gradient L'(ζ) is so small that the value of the error function cannot be further decreased. As such, step 130 of evaluating the error function may comprise evaluating the gradient L'(ζ) of the error function.

The probe profile $\hat{H}_z(k; \zeta)$ may be calculated based on the estimated aberration parameter ζ and the known relative difference in the measurement condition (or based on the known value of the measurement condition). The settings of the charged-particle tool 40, such as the numerical aperture NA of the charged-particle tool 40 and the average wavelength of the charged-particle tool 40, may also be taken into account in the calculation of the probe profile $\hat{H}_z(k; \zeta)$. For example, the probe profile $\hat{H}_z(k; \zeta)$ may comprise a contribution due to aberrations (as represented by the aberration parameter ζ) and a contribution due to the position z of the sample 208 relative to the plane of focus (z=0) of the objective lens 231.

The contribution due to the aberrations may be expressed in terms of the pupil function P(k). The pupil function P(k) is indicative of the amplitude and the phase of the charged-particle beam in the plane of the objective lens 231, i.e. in the pupil plane. In the ideal case (i.e. if no aberrations are present), the pupil function P(k) has both uniform amplitude and phase. In practice, aberrations are expressed as deviations from the uniform amplitude and phase.

Aberrations may cause deviation from both the uniform amplitude and the uniform phase. Aberrations may be represented using the Zernike polynomials. Each Zernike polynomial corresponds to a particular type of aberration. The pupil function P(k) may thus be expressed as:

$P(k)=[\Sigma_i \zeta_i Z_i(k)]\exp\{i2\pi[\Sigma_j \zeta_j Z_j(k)]\}$ where $Z_{i,j}(k)$ is the Zernike polynomial, $\zeta_{i,j}$ is the corresponding weight (i.e. the respective aberration value of the aberration parameter ζ), and i and j represent the indices of the amplitude and the phase respectively. In an embodiment, only the set of $\zeta_j$ is considered to represent the aberrations of the charged-particle beam tool 40. Optionally, the set of $\zeta_i$ may also be considered. In an embodiment, at least the first 15 Zernike polynomials are taken into account, and the aberration parameter is a vector comprising at least 15 aberration values $\zeta=\zeta_1, \zeta_2, \ldots, \zeta_{15}$. In another embodiment, at least the first 37 Zernike polynomials are taken into account, and the aberration parameter is a vector comprising at least 37 aberration values $\zeta=\zeta_1, \zeta_2, \ldots, \zeta_{37}$.

The contribution due to the position z of the sample 208 relative to the plane of focus (z=0) of the objective lens 231 may be expressed by a defocus term, in particular by the defocus term $\exp(i\pi z|k|^2)$. For example, the probe profile in the image plane at position z may be calculated as:

$H_z(r)=|FT\{P(k)\exp(i\pi z|k|^2)\}(r)|^2$ where FT represents the Fourier transform and $\hat{H}_z(k; \zeta)=FT\{H_z(r)\}(k)$. If the position z of the sample 208 relative to the plane of focus (z=0) of the objective lens 231 is constant (e.g. if the measurement condition comprises an amount of astigmatism applied to the charged-particle beam, and the amount of defocus remains constant), then the defocus term $\exp(i\zeta z|k|^2)$ may be omitted. As mentioned above, when the measurement condition comprises an amount of astigmatism applied to the charged-particle beam, the sample 208 may deliberately be out of focus, so as to magnify the effect of varying the amount of astigmatism. In analogy to optics, the propagation of charged particles (e.g. electrons) from the pupil (i.e. the plane of the objective lens 231) to the image plane is described using the Fourier transform FT, r and k are coordinates of the pupil and the image plane respectively, P(k) is the pupil function of the charged-particle beam, and $\exp(i\pi z|k|^2)$ represents the defocus term (which will be equal to 1 in the plane of focus z=0). Here, r is normalized by a factor of λ/NA, where λ is the wavelength of the charged particles and NA is the numerical aperture (half focusing angle) of the objective lens 231. The factor λ/NA determines the scaling of the size of the probe profile. The wavelength λ of the charged particles is related to the kinetic energy (or landing energy) of the charged particles. For example, for electrons the wavelength can be calculated as $\lambda = 6.62 \times 10^{-34}/\sqrt{2 \times 9.1 \times 10^{-31} \times 1.6 \times 10^{-19} E}$, where $$6.62 \times 10^{-34} \frac{m^2 kg}{s}$$

is the Planck constant, $9.1 \times 10^{-31}$ kg is the electron rest mass, $1.6 \times 10^{-19}$ C is the electron elementary charge and E is the kinetic energy. The numerical aperture NA and the wavelength λ may be settings of the charged-particle beam tool 40, and may be at least approximately known to an operator of the charged-particle beam tool 40.

Optionally, additional or other contributions to the probe profile $H_z(r)$ may be taken into account.

For example, in the charged-particle beam tool 40, the charged particles emitted by the charged-particle source 201 may have a distribution of kinetic energy. This distribution of kinetic energy induces a defocusing effect, because charged particles at different speeds will be focused at different locations along the primary optical axis 204. As a result, the overall probe profile will be a weighted sum of the probe profile for charged particles of each kinetic energy. The term of the induced defocus may be expressed as, for example:

$$\Phi(k; \Delta E) = \frac{1}{2} \frac{\Delta E}{E} \frac{C_c}{\lambda} NA^2 |k|^2,$$

where E is the nominal or average kinetic energy, $\Delta E$ is the deviation from E, and $C_c$ is a coefficient of chromatic aberration. The total probe profile may thus be calculated as:

$$H_z(r) = \int \exp\left(-\frac{\Delta E}{2\sigma_E^2}\right) |FT\{P(k)\exp(i\pi z |k|^2)\Phi(k; \Delta E)\}(r)|^2 d\Delta E,$$

where exp $$\exp[-\Delta E / (2\sigma_E^2)]$$

represents the Gaussian distribution of $\Delta E$, and $\sigma_E$ is the variance of $\Delta E$. The distribution of $\Delta E$ may depend on the exact nature of the charged-particle source 201, and the Gaussian distribution used above is only one example of a possible distribution.

If the charged-particle source 201 is not exactly an infinitely small point source, the formula for the probe profile $H_z(r)$ may further be modified as follows:

$$H_z(r) =$$

$$\left[\int \exp\left(-\frac{\Delta E}{2\sigma_E^2}\right) |FT\{P(k)\exp(i\pi z |k|^2)\Phi(k; \Delta E)\}(r)|^2 d\Delta E\right] * \exp\left(-\frac{|r|^2}{2\sigma_s^2}\right),$$

where * is the convolution operator, exp $$\exp\left[-|r|^{\wedge}2 / (2\sigma_s^2)\right]$$

represents the Gaussian distribution of source intensity and $\sigma_s$ is the variance of the source intensity. The distribution of source intensity depends on the exact nature of the charged-particle source 201, and the Gaussian distribution used above is only one example of a possible distribution. Alternatively, an imaginary component may be added to the defocus term $\exp(i\pi z|k|^2)$ to account for the non-zero virtual source size. This may enable the determination of the virtual source size (for example in addition to the aberration coefficients and the source intensity variance), as explained below.

The formula for the probe profile $H_z(r)$ may further be modified to take into account the variation of the stigmator value, for example when the stigmator value is deliberately adjusted so as to adjust the measurement condition. This can be expressed by the additional term $\exp(i2\pi\Delta\zeta_j Z_j(k))$, where $Z_j(k)$ is the Zernike polynomial that describes the astigmatism induced by the stigmator value and $\Delta\zeta_j$ the relative change of the corresponding aberration value. For Zernike polynomials, j=5 and j=6 are two types of astigmatism: along the x-y axes or at 45 degrees with respect to the x-y axes. However, any other types of astigmatism (and corresponding Zernike polynomials) that can be adjusted by the astigmatism compensator of the charged-particle tool may be taken into account in the adjustment of the formula for the probe profile $H_z(r)$.

The method 100 comprises a step 160 of updating the estimated aberration parameter. In an embodiment, the estimated aberration parameter is updated based on the gradient of the error function. The gradient of the error function may provide an indication whether to increase or decrease the estimated aberration parameter so as to decrease the value of the error function. The gradient of the error function may provide an indication as to how much to increase or decrease the estimate aberration parameter. The gradient of the error function may be used to update the estimated aberration parameter such that the value of the error function is decreased compared to the value of the error function based on the previous estimated aberration parameter.

The method 100 comprises iteratively performing the step 130 of evaluating the error function, optionally the step 130' of calculating the gradient of the error function, and the step 160 of updating the estimated aberration parameter. Put another way, the steps 130 and 160, and optionally the step 130', are performed repeatedly. The number of iterations may be predetermined. The method 100 may comprise determining the final aberration parameter as the estimated aberration parameter that provides the smallest value of the error function.

In an embodiment, the method 100 comprises iteratively performing the step 130 of evaluating the error function, optionally the step 130' of calculating the gradient of the error function, and the step 160 of updating the estimated aberration parameter, until the value of the error function is below a threshold, in particular a predetermined threshold. The method 100 may comprise iteratively performing the steps of comparing the value of the error function to the predetermined threshold, updating the estimated aberration parameter when the value of the error function is greater than the predetermined threshold, and evaluating the error function based on the updated estimated aberration parameter.

Additionally, the method 100 may comprise iteratively performing the step 130 of evaluating the error function, the step 130' of calculating the gradient of the error function, and the step 160 of updating the estimated aberration parameter, until also the gradient of the error function is below a second threshold, in particular a second predetermined threshold. The method 100 may comprise iteratively performing the steps of comparing the gradient of the error function to the second predetermined threshold, updating the estimated aberration parameter when the gradient of the error function is greater than the second predetermined threshold, and calculating the gradient of the error function based on the updated estimated aberration parameter.

The estimated aberration parameter is thus updated iteratively until the value of the error function and optionally the gradient of the error function is equal to or below a respective threshold. The method 100 comprises a step 170 of determining the final aberration parameter that provided the value of the error function below the threshold. The final aberration parameter may be set equal to the estimated aberration parameter that provided a value of the error function or the gradient of the error function below the threshold. Evaluating the error function based on the final aberration parameter may thus provide a minimum or substantially minimum value of the error function. The final aberration parameter may thus be a comparably accurate representation of the actual aberrations in the two or more images.

The method 100 may comprise a step 180 of removing or reducing the contribution of the aberrations from at least one image of the sample 208 obtained by the charged-particle beam tool 40. The step 180 of removing or reducing the contribution of the aberrations from at least one image of the sample 208 obtained by the charged-particle beam tool 40 may occur inherently when performing the method 100, i.e. performing the method 100 may automatically generate an image of the sample 208 without or with reduced aberrations, without requiring a final step 180 of removing or reducing the contribution of aberrations to be performed separately. The contribution of the aberrations may be removed or reduced based on the final aberration parameter. The at least one image may be at least one image of the two or more images obtained by the charged-particle beam tool 40 in step 110. For example, taking into account that $I_z(r)=O(r)*H_z(r; \zeta)$ removing or reducing the contribution of the aberrations from the at least one image $I_z(r)$ may comprise performing deconvolution of the at least one image $I_z(r)$ with the probe profile $H_z(r; \zeta)$ calculated based on the final aberration parameter, thereby extracting the object $O(r)$ from the at least one image $I_z(r)$.

Figure 4:
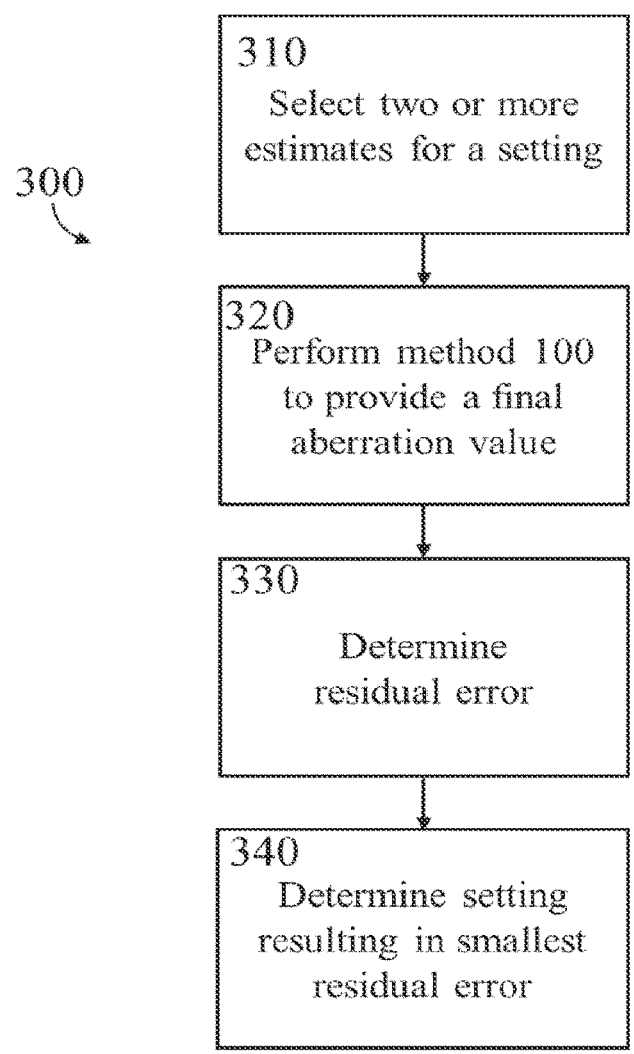
FIG. 4 illustrates a flowchart representing a method of determining a setting of a charged-particle beam tool of FIG. 2, consistent with embodiments of the present disclosure.

FIG. 4 shows an exemplary method 300 of determining a setting, in particular an actual setting, of the charged-particle beam tool 40 in accordance with an embodiment of the present disclosure. The setting of the charged-particle beam tool 40 may be the numerical aperture NA of the objective lens 231. Alternatively, the setting of the charged-particle beam tool 40 may be the nominal wavelength λ of the charged particles used in the charged-particle beam tool 40. The nominal wavelength λ of the charged particles may be the average of mean wavelength λ of the charged particles. Alternatively, the setting of the charged-particle beam tool 40 may be a virtual source size of the charged-particle beam tool 40. The setting of the charged-particle beam tool 40 may be any other setting or parameter that has an effect on the probe profile of the primary charged-particle beam 202.

In some situations, the setting of the charged-particle beam tool 40 may only be known approximately. For example, in some situations, the numerical aperture NA of the objective lens 231 or the wavelength λ of the charged particles may be known only approximately. The settings of the charged-particle beam tool 40 affect the probe profile of the primary charged-particle beam 202. Therefore, any inaccuracies in the setting of the charged-particle beam tool 40 may contribute to the error function. Using approximate estimates for the settings of the charged-particle beam tool 40 in the method 100 of determining aberrations may have an effect on the value of the error function. In particular, the approximate estimates for the settings will contribute to a residual error of the error function when evaluated based on the final aberration parameter. This residual error may be taken into account to determine the actual setting of the charged-particle beam tool 40.

The method 300 may comprise a step 310 of selecting two or more estimates for the setting of the charged-particle beam tool 40. The two or more estimates may comprise two or more estimates at regular intervals within an estimated range of the setting. For example, an operator of the charged-particle beam tool 40 may know that the numerical aperture NA of the charged-particle beam tool 40 is in the range between 0 mrad and 30 mrad, but may not know the exact numerical aperture NA. The two or more estimates may comprise all numerical apertures within the range at 1 mrad intervals.

The method 300 may further comprise a step 320 of performing the method 100 of determining aberrations in images for each of the selected two or more estimates of the setting. Each time the method 100 is performed, the error function may be evaluated based on a different one of the two or more estimates for the setting. For each one of the two or more estimates for the setting, a respective final aberration parameter may be determined.

The method 300 may further comprise a step 330 of determining a residual error for each estimate of the setting. The residual error may be determined by evaluating the error function based on each estimate for the setting and the respective final aberration parameter determined for the respective setting. The residual error may be smaller if the estimate for the setting is relatively accurate (i.e. close to the actual value of the setting), and may be greater if the estimate for the setting is relatively inaccurate (i.e. further away from the actual value of the setting).

The method 300 may further comprise a step 340 of determining, as the setting of the charged-particle beam tool 40, the estimate of the setting that results in the smallest residual error. This may be achieved by comparing the residual errors for each respective estimate of the setting and identifying the smallest residual error and associated estimate of the setting. Optionally, determining the setting that results in the smallest residual error may comprise plotting a curve of the determined residual errors, and identifying the setting corresponding to the minimum of the curve. The curve may be fitted to the residual errors that were determined. The curve may be fitted to a polynomial curve, a spline curve, a Gaussian curve, or any other curve. The smallest residual error may be determined from the fitted curve. This may reduce the number of different settings of the charged-particle beam tool 40 that need to be considered to arrive at an accurate estimate of the actual setting.

The method 300 may comprise determining the final aberration parameter, i.e. the final aberration parameter that is considered to be closest to the actual aberration parameter, by performing the method 100 using the setting of the charged-particle beam tool 40 determined by step 340 of the method 300.

Alternatively, the method 100 may be used to determine the setting of the charged-particle beam tool 40, in a manner analogous to the determination of the final aberration values. For this purpose, the estimated aberration parameter may (in addition to the one or more estimated aberration values) comprise a setting value representing the setting of the charged-particle beam tool 40. The setting value may, for example, be the numerical aperture NA or the nominal wavelength of the charged particles. Alternatively, the setting value may represent the virtual source size of the charged-particle beam tool 40, for example the variance $\sigma_s^2$ of the source intensity in the Gaussian distribution $\exp[-|r|^2/(2\sigma_s^2)]$ of source intensity or the size of the imaginary component of the defocus term $\exp(i\pi z|k|^2)$ (depending on how the virtual source size is represented). The setting value may be iteratively updated in the same manner as the other estimated aberration values when carrying out the method 100. The final setting value may be determined to correspond to the estimated setting value that provides the smallest value of the error function.

The inventors have realized that in some applications, for example in a multi-beam charged-particle beam tool in which the beamlets 211, 212, 213 share a common macro electro-optical element, the aberrations in images obtained using a first beamlet 211, 212, 213 are not independent from the aberrations in images obtained using one or more further beamlets 211, 212, 213. The common macro electro-optical element may be a common charged-particle beam source, a common condenser or collimator lens, a common objective lens, or any other common element that is used to manipulate two or more of the beamlets 211, 212, 213. This allows information about aberrations determined for the first beamlet 211, 212, 213 to be used to assist in the determination of the aberrations for the one or more further beamlets 211, 212, 213. Aberrations determined for the first beamlet 211, 212, 213 may also be used to assist in the determination of the aberrations for the one or more further beamlets 211, 212, 213 when the beamlets 211, 212, 213 do not share a common macro electro-optical component. Even when the aberrations of the beamlets 211, 212, 213 are independent, the aberrations of each beamlet 211, 212, 213 may be relatively similar (e.g. when the individual electro-optical elements operate relatively similar), allowing the aberrations determined for the first beamlet 211, 212, 213 to assist in the determination of the aberrations for the one or more further beamlets 211, 212, 213.

In an embodiment, there is provided a method of determining aberrations in images obtained by a multi-beam charged-particle beam tool. The multi-beam charged-particle beam tool may be configured to create a plurality of beamlets 211, 212, 213, optionally from a common charged-particle beam source, for example in the manner described with reference to FIG. 2. The method comprises performing the method 100 for a first beamlet of the multi-beam charged-particle tool. This comprises obtaining two or more images of a sample using the first beamlet of the charged-particle beam tool. Each image is obtained at a known relative difference in a measurement condition of the first beamlet of the charged-particle beam tool. An estimated aberration parameter for the first beamlet is then selected for the aberrations of a probe profile representing the first beamlet used by the charged-particle beam tool. An error function that is indicative of the difference between the two or more images and two or more estimated images that are a function of the estimated aberration parameter and the known relative difference in the measurement condition is then evaluated, and the estimated aberration parameter is updated. This is performed iteratively. The final aberration parameter for the first beamlet is selected as the estimated aberration parameter for the first beamlet that provides the smallest value of the error function.

The estimated aberration parameter for the first beamlet may comprise a plurality of estimated aberration values for the first beamlet. Determining the final aberration parameter thus comprises determining a plurality of final aberration values for the first beamlet. The estimated aberration parameter and the final aberration parameter may represent a set of Zernike polynomials. Each estimated aberration value and each final aberration value represents a weight of a respective Zernike polynomial.

The final aberration values for the first beamlet 211, 212, 213 may then be used to assist in the determination of final aberration values for each one or more further beamlet 211, 212, 213. This comprises performing the method 100 for each one or more further beamlet 211, 212, 213 of the multi-beam charged-particle tool 40. The step of selecting the estimated aberration parameter may comprises selecting one or more final aberration values determined for the first beamlet 211, 212, 213 as corresponding one or more estimated aberration values for each one or more further beamlets 211, 212, 213. Put another way, at least some of the estimated aberration values for the one or more further beamlets are set to the corresponding final aberration values determined for the first beamlet. Optionally, all of the estimated aberration values for the one or more further beamlets are set to the final aberration values determined for the first beamlet (at least in the first iteration of the method 100). Alternatively, at least some of the estimated aberration values may not be set to the corresponding final aberration values determined for the first beamlet 211, 212, 213.

The inventors have found that it is in particular, the higher order aberration values (i.e. the aberration values representing the weight of relatively higher order Zernike polynomials) that are the same or relatively similar among the multiple beamlets 211, 212, 213 of the multi-beam charged-particle beam tool 40. The lower order aberration values (i.e. the aberration values representing the weight of relatively lower order Zernike polynomials) may be relatively different among the multiple beamlets 211, 212, 213 of the multi-beam charged-particle beam tool. As such, the step of selecting the estimated aberration parameter may comprises selecting one or more higher order final aberration values (e.g. at least the n highest order final aberration value, where n is 1, 3, 6, 10, 15 or 21 or where n is 5%, 10%, 25%, 50%, 75% or 90% of the total number of final aberration values) determined for the first beamlet 211, 212, 213 as corresponding one or more higher order estimated aberration values for each one or more further beamlet 211, 212, 213. Optionally, the step of selecting the estimated aberration parameter may comprises not selecting one or more lower order final aberration values (e.g. at least the m lowest order final aberration values, where m is 1, 3, 6, 10, 15 or 21 or where m is 5%, 10%, 25%, 50%, 75% or 90% of the total number of final aberration values) determined for the first beamlet 211, 212, 213 as corresponding one or more lower order estimated aberration values for each one or more further beamlet 211, 212, 213.

The higher order estimated aberration values may be assumed to be the same or relatively similar for the multiple beamlets 211, 212, 213 of the multi-beam charged-particle beam tool 40. As such, the higher order estimated aberration values determined for the first beamlet 211, 212, 213 may be assumed to be correct also for the one or more further beamlets 211, 212, 213. The step of updating the estimated aberration parameter for each one or more further beamlet 211, 212, 213 may comprises updating estimated aberration values that do not correspond to the one or more estimated aberration values that were selected to correspond to the one or more final aberration values determined for the first beamlet. The step of updating the estimated aberration parameter may comprise not updating estimated aberration values that correspond to the one or more estimated aberration values that were selected to correspond to the one or more final aberration values determined for the first beamlet. For example, the step of updating the estimated aberration parameter for each one or more further beamlet 211, 212, 213 may comprise updating one or more lower order estimated aberration values (e.g. at least the lowest order final aberration value, or at least the n lowest order final aberration values, where n is greater than 10% or 25% or 50% or 75% or 90% of the total number of final aberration values). The step of updating the estimated aberration parameter for each one or more further beamlet 211, 212, 213 may comprise not updating one or more higher order estimated aberration values (e.g. at least the highest order final aberration value, or at least the n highest order final aberration values, where n is greater than 10% or 25% or 50% of the total number of final aberration values or where n is 3, 6, 10, 15 or 21). Optionally, n+m may be equal to the total number of final aberration values.

In an embodiment, the charged-particle beam tool 40 comprises the illumination system and the detection system. The illumination system is configured to generate a charged-particle beam and scan the charged-particle beam across the sample 208. The illumination system may comprise an astigmatism compensator or stigmator, particularly (but not exclusively) when the measurement condition is an amount of astigmatism. The detection system is configured to capture charged particles interacting with the sample, thereby creating an image of the sample. The charged-particle tool 40 comprises the controller 50. The controller 50 is configured to perform the method 100 or the method 300, or both. The charged-particle beam tool 40 may be an electron beam tool.

In an embodiment, there is provided a computer program product. The computer program product comprises instructions which, when the program is executed by a computer, cause the computer to carry out the method 100 or the method 300, or both.

In an embodiment, there is provided a computer-readable storage medium. The computer-readable storage medium comprises instructions which, when executed by a computer, cause the computer to carry out the method 100 or the method 300, or both.

FIGS. 5a-5c and 6 show experimental results obtained by performing the method 100, thereby determining aberrations in images captured by an SEM, and by performing the method 300, thereby determining the numerical aperture NA of the SEM. The stigmator value (indicative of the astigmatism of the electron beam of the SEM) was deliberately varied, so as to induce different amounts of aberration in the images obtained by the SEM. For each stigmator value, three images were measured: one in the plane of focus and two in defocused planes (±400 nm). The method 100 was performed initially based on an estimate of the numerical aperture NA of 15 mrad, and a final aberration parameter was determined for each stigmator value. As shown by the dotted curves in the FIG. 5c, a linear relation between the determined final aberration parameters and the stigmator values can be observed for NA=15 mrad.

Figure 5:
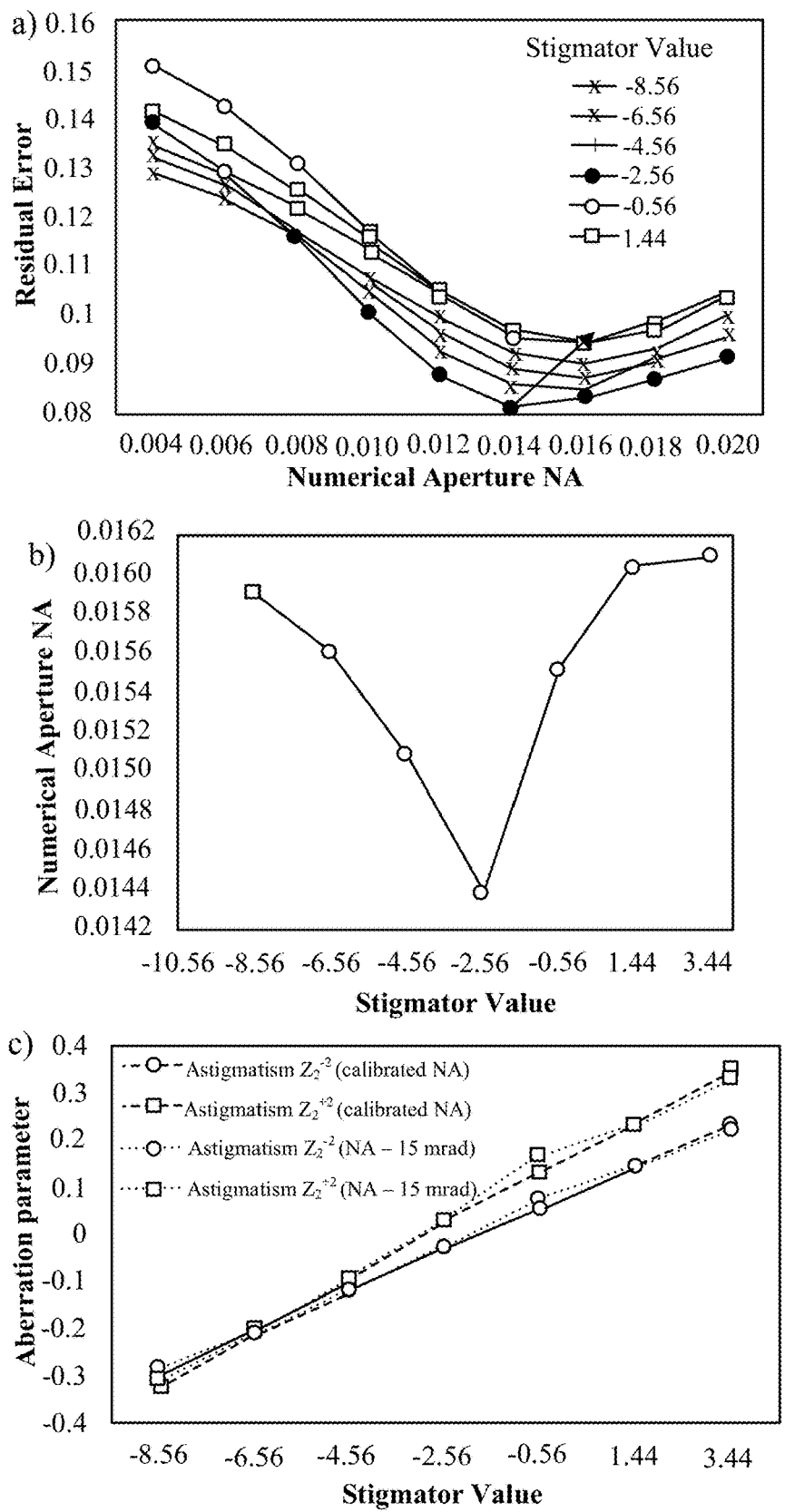
FIGS. 5*a*-5*c* illustrate data plots of experimental results obtained by performing methods of FIGS. 3 and 4, consistent with embodiments of the present disclosure.

The method 300 was then performed by selecting estimates for the numerical aperture NA ranging from 4 mrad to 24 mrad in 2 mrad steps, and performing the method 100 based on each of these selected estimates for the numerical aperture NA. The residual error was determined for each combination of stigmator value (i.e. level of aberration) and numerical aperture NA estimate. The results are plotted in FIG. 5a, which shows that the residual error depends on the numerical aperture NA estimate for each stigmator value. Furthermore, the minimum residual error is obtained at a different numerical aperture NA estimate for different stigmator values. This is also shown in FIG. 5b, in which the numerical aperture NA estimate that was determined to correspond to the actual numerical aperture NA (i.e. the numerical aperture NA estimate corresponding to the minimum residual error in FIG. 5a) is plotted against the stigmator value. As apparent from FIG. 5b, the actual numerical aperture NA of the SEM changes as the stigmator value is adjusted. Finally, the dashed lines in FIG. 5c show the relation between final aberration parameters and the stigmator values for a calibrated numerical aperture NA, i.e. when using the numerical apertures NA determined by the method 300. As readily apparent, the correlation between the determined final aberration parameters and the stigmator values is improved compared to the situation in which the numerical aperture NA estimate was fixed at 15 mrad.

Figure 6:
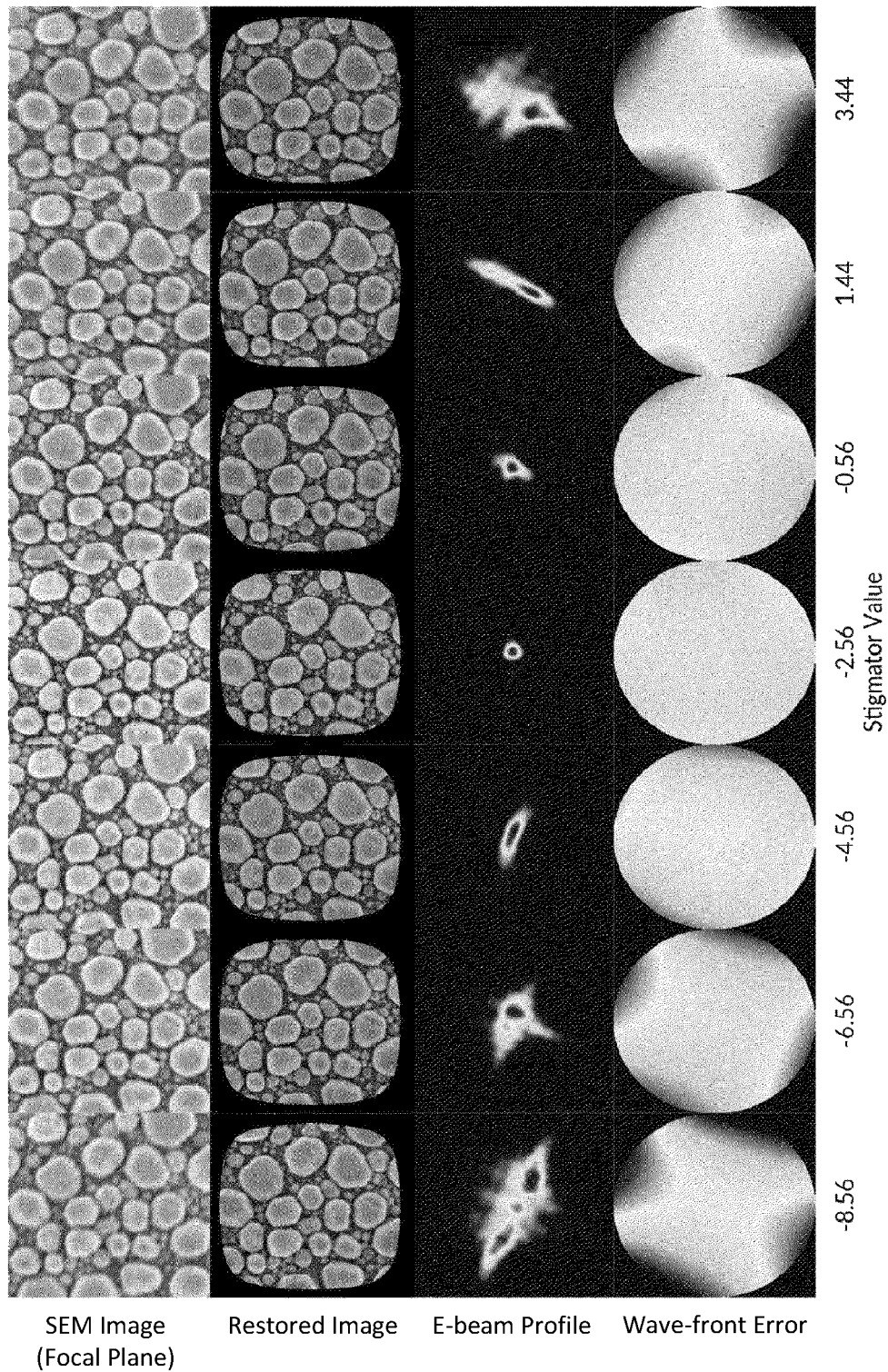
FIG. 6 illustrates experimental results, consistent with embodiments of the present disclosure.

FIG. 6 shows the SEM image obtained in the plane of focus of the SEM for different stigmator values, along with images that were restored based on the final aberration parameters determined by method 100 and based on the calibrated numerical aperture NA determined by the method 300 for each stigmator value. FIG. 6 also shows the calculated probe profile and the wavefront error at each stigmator value.

The embodiments may further be described using the following clauses:

1. A method of determining aberrations in images obtained by a charged-particle beam tool, the method comprising the steps of:
   a) obtaining two or more images of a sample using the charged-particle beam tool, wherein each image is obtained at a known relative difference in a measurement condition of the charged-particle beam tool;
   b) selecting an estimated aberration parameter for the aberrations of a probe profile representing the charged-particle beam used by the charged-particle beam tool;
   c) evaluating an error function indicative of the difference between the two or more images and two or more estimated images that are a function of the estimated aberration parameter and the known relative difference in the measurement condition;
   d) updating the estimated aberration parameter;
   e) performing steps c) and d) iteratively; and
   f) determining the final aberration parameter as the estimated aberration parameter that provides the smallest value of the error function.
2. The method of clause 1, wherein step e) comprises performing steps c) and d) iteratively until the value of the error function is below a threshold.
3. The method of clause 1 or 2, wherein updating the estimated aberration parameter comprises calculating a gradient of the error function based on the estimated aberration parameter, and updating the estimated aberration parameter based on the gradient of the error function.
4. The method of clause 3, wherein step e) comprises performing steps c) and d) iteratively until the gradient of the error function is below a second threshold.
5. The method of any preceding clause, wherein evaluating the error function comprises: calculating an estimated probe profile for each image based on the estimated aberration parameter and the known relative difference in the measurement condition, calculating, for each image of the two or more images, the difference between the image and an estimated image that is estimated based on a respective estimated probe profile, and summing the calculated differences.
6. The method of any preceding clause, wherein the error function $L(\zeta)$ is $$L(\zeta) = \sum_k \int \left[ \frac{\left| \sum_z \hat{I}_z(k) \hat{H}_z(k;\zeta)^* \right|^2}{\sum_z |\hat{H}_z(k;\zeta)|^2} - \sum_z |\hat{I}_z(k)|^2 \right] dk$$

where each $\hat{I}_z(k)$ is a respective image of the two or more images in the plane at distance z with respect to the plane of focus and each $\hat{H}_z(r;\zeta)$ is an estimated probe profile for the respective image, wherein the estimated probe profile is calculated based on the estimated aberration parameter ζ and the known relative difference in the measurement conditions.

7. The method of clauses 3 and 6, wherein the gradient of the error function is $$L'(\zeta) = \sum_z \int 2\Re \left\{ \frac{\left[\sum_k \hat{I}_z(k)\hat{H}_z(k;\zeta)^*\right]\left[\sum_k \hat{I}_z(k)^*\hat{H}'_z(k;\zeta)\right]}{\sum_k |\hat{H}_z(k;\zeta)|^2} - \frac{\left|\sum_k \hat{I}_z(k)\hat{H}_z(k;\zeta)^*\right|^2 \left[\sum_k \hat{H}_z(k;\zeta)^*\hat{H}'_z(k;\zeta)\right]}{\left(\sum_k |\hat{H}_z(k;\zeta)|^2\right)^2} \right\} dk$$

where $\Re$ represents the real part of the term in brackets, and $\hat{H}'_z(k; \zeta)$ represents the gradient of $\hat{H}'_z(k; \zeta)$ with respect to the aberration parameter ζ.

8. The method of any preceding clause, wherein the measurement condition of the charged-particle beam tool is one of:
a position of the sample, along a primary optical axis of the charged-particle beam tool, relative to the plane of focus of the charged-particle beam tool, an amount of beam shaping applied to the charged-particle beam, an average landing energy of the charged particles in the charged-particle beam, or any combination thereof 9. The method of any preceding clause, further comprising removing or reducing the aberrations in at least one image of the sample obtained by the charged-particle beam tool based on the final aberration parameter.

10. A method of determining a setting of the charged-particle beam tool, the method comprising: performing the method of any one of the preceding clauses two or more times, each time based on a different estimate for the setting of the charged-particle beam tool, determining a residual error for each estimate of the setting by evaluating the error function based on the final aberration parameter determined for the respective estimate of the setting, determining as the setting of the charged-particle beam tool the estimate of the setting resulting in the smallest residual error.

11. The method of clause 10, wherein the setting of the charged-particle beam tool is the numerical aperture of an objective lens of the charged-particle beam tool and/or the nominal wavelength of the charged particles used in the charged-particle beam tool.

12. The method of clause 10 or 11, comprising determining the final aberration parameter by performing the method of any one of clauses 1 to 8 using the determined setting of the charged-particle beam tool.

13. The method of any preceding clause, wherein the charged-particle beam tool is an electron beam tool, and wherein the charged-particle beam is an electron beam.

14. A charged-particle beam tool comprising an illumination system configured to generate a charged-particle beam and to scan the charged-particle beam across a sample, a detection system configured to capture charged particles interacting with the sample, thereby creating an image of the sample, and a controller configured to perform the method of any preceding clause.

15. The charged-particle beam tool of clause 14, wherein the charged-particle beam tool is an electron beam tool.

16. A computer program product comprising instructions which, when the program is executed by a computer, cause the computer to carry out the method of any one of clauses 1 to 13.

17. A computer-readable storage medium comprising instructions which, when executed by a computer, cause the computer to carry out the method of any one of clauses 1 to 13.

18. The method of any one of the clauses 1 to 13, wherein the measurement condition of the charged-particle beam tool is an amount of astigmatism applied to the charged-particle beam.

19. A charged-particle beam tool comprising an illumination system configured to generate a charged-particle beam and to scan the charged-particle beam across a sample, the illumination system comprising an astigmatism compensator configured to adjust the amount of astigmatism applied to the charged-particle beam;
a detection system configured to capture charged particles interacting with the sample, thereby creating an image of the sample, and a controller configured to perform the method of clause 18.

20. A method of determining aberrations in images obtained by a multi-beam charged-particle beam tool, the method comprising performing the method of any one of clauses 1 to 13 or 18 for a first beamlet of the multi-beam charged-particle tool, wherein the estimated aberration parameter comprises a plurality of estimated aberration values, thereby determining a final aberration parameter comprising a plurality of final aberration values for the first beamlet; performing the method of any one of clauses 1 to 13 or 18 for each of one or more further beamlets of the multi-beam charged-particle tool, wherein the step of selecting the estimated aberration parameter comprises selecting one or more final aberration values determined for the first beamlet as corresponding one or more estimated aberration values for each one or more further beamlet, and wherein the step of updating the estimated aberration parameter comprises updating estimated aberration values that do not correspond to the one or more estimated aberration values that were selected to correspond to the one or more final aberration values determined for the first beamlet.

21. The method of clause 20, wherein when performing the method for the one or more further beamlets of the multi-beam charged-particle tool, the step of selecting the estimated aberration parameter comprises selecting one or more higher order final aberration values determined for the first beamlet as corresponding one or more higher order estimated aberration values for each one or more further beamlet, and the step of updating the estimated aberration parameter comprises updating one or more lower order estimated aberration values that do not correspond to the one or more higher order estimated aberration values that were selected to correspond to the one or more higher order final aberration values determined for the first beamlet.

22. The method of clause 21, wherein the one or more higher order estimated aberration values are the n highest order estimated aberration values, and wherein the one or more lower order estimated aberration values are the m lowest order estimated aberration values, where n+m is equal to the total number of estimated aberration values.

23. The method of clause 22, wherein n is greater or equal to 1 and less than the total number of estimated aberration values.

24. The method of clause 20 or 21, wherein the estimated aberration parameter and the final aberration parameter represent a set of Zernike polynomials, wherein each estimated aberration value and each final aberration value represents a weight of a respective Zernike polynomial.

While specific embodiments of the disclosure have been described above, it will be appreciated that the disclosure may be practiced otherwise than as described. The descriptions above are intended to be illustrative, not limiting. Thus, it will be apparent to one skilled in the art that modifications may be made to the disclosure as described without departing from the scope of the claims set out below.

What is claimed is:

1. A method of determining aberrations in images obtained by a charged-particle beam tool, the method comprising:
   a) obtaining two or more images of a sample using the charged-particle beam tool, wherein each image is obtained at a known relative difference in a measurement condition of the charged-particle beam tool;
   b) selecting an estimated aberration parameter for the aberrations of a probe profile representing the charged-particle beam used by the charged-particle beam tool;
   c) evaluating an error function indicative of the difference between the two or more images and two or more estimated images that are a function of the estimated aberration parameter and the known relative difference in the measurement condition;
   d) updating the estimated aberration parameter;
   e) performing processes c) and d) iteratively; and
   f) determining the final aberration parameter as the estimated aberration parameter that provides the smallest value of the error function.

2. The method of claim 1, wherein process e) comprises performing processes c) and d) iteratively until the value of the error function is below a first threshold.

3. The method of claim 1, wherein updating the estimated aberration parameter comprises calculating a gradient of the error function based on the estimated aberration parameter, and updating the estimated aberration parameter based on the gradient of the error function.

4. The method of claim 3, wherein process e) comprises performing processes c) and d) iteratively until the gradient of the error function is below a second threshold.

5. The method of claim 1, wherein evaluating the error function comprises:
   calculating an estimated probe profile for each image based on the estimated aberration parameter and the known relative difference in the measurement condition;
   calculating, for each image of the two or more images, the difference between the image and an estimated image that is estimated based on a respective estimated probe profile; and
   summing the calculated differences.

6. The method of claim 1, wherein the error function L($\zeta$) is $$L(\zeta) = \sum_z \int \left[ \frac{\left|\sum_k \hat{I}_z(k)\hat{H}_z(k;\zeta)^*\right|^2}{\sum_k |\hat{H}_z(k;\zeta)|^2} - \sum_k |\hat{I}_z(k)|^2 \right] dk$$

where each $\hat{I}_z(k)$ is a respective image of the two or more images in the plane at distance z with respect to the plane of focus and each $\hat{H}_z(r;\zeta)$ is an estimated probe profile for the respective image, wherein the estimated probe profile is calculated based on the estimated aberration parameter $\zeta$ and the known relative difference in the measurement conditions.

7. The method of claim 3, wherein the error function L($\zeta$) is $$L(\zeta) = \sum_z \int \left[ \frac{\left|\sum_k \hat{I}_z(k)\hat{H}_z(k;\zeta)^*\right|^2}{\sum_k |\hat{H}_z(k;\zeta)|^2} - \sum_z |\hat{I}_z(k)|^2 \right] dk$$

where each $\hat{I}_z(k)$ is a respective image of the two or more images in the plane at distance z with respect to the plane of focus and each $\hat{H}_z(r;\zeta)$ is an estimated probe profile for the respective image, wherein the estimated probe profile is calculated based on the estimated aberration parameter $\zeta$ and the known relative difference in the measurement conditions.

8. The method of claim 3, wherein the gradient of the error function is $$L'(\zeta) = \sum_z \int 2\mathfrak{R}\left\{ \frac{\left[\sum_k \hat{I}_z(k)\hat{H}_z(k;\zeta)^*\right]\left[\sum_k \hat{I}_z(k)^* \hat{H}'_z(k;\zeta)\right]}{\sum_k |\hat{H}_z(k;\zeta)|^2} - \frac{\left|\sum_k \hat{I}_z(k)\hat{H}_z(k;\zeta)^*\right|^2 \left[\sum_k \hat{H}_z(k;\zeta)^* \hat{H}'_z(k;\zeta)\right]}{\left(\sum_k |\hat{H}_z(k;\zeta)|^2\right)^2} \right\} dk$$

where $\mathfrak{R}$ represents the real part of the term in brackets, $\hat{H}_z'(k;\zeta)$ represents the gradient of $\hat{H}_z(k;\zeta)$ with respect to the aberration parameter $\zeta$.

9. The method of claim 6, wherein a gradient of the error function is $$L'(\zeta) = \sum_z \int 2\mathfrak{R}\left\{ \frac{\left[\sum_k \hat{I}_z(k)\hat{H}_z(k;\zeta)^*\right]\left[\sum_k \hat{I}_z(k)^* \hat{H}'_z(k;\zeta)\right]}{\sum_k |\hat{H}_z(k;\zeta)|^2} - \frac{\left|\sum_k \hat{I}_z(k)\hat{H}_z(k;\zeta)^*\right|^2 \left[\sum_k \hat{H}_z(k;\zeta)^* \hat{H}'_z(k;\zeta)\right]}{\left(\sum_k |\hat{H}_z(k;\zeta)|^2\right)^2} \right\} dk$$

where $\mathfrak{R}$ represents the real part of the term in brackets, and $\hat{H}_z'(k;\zeta)$ represents the gradient of $\hat{H}_z(k;\zeta)$ with respect to the aberration parameter $\zeta$.

10. The method of claim 1, wherein the measurement condition of the charged-particle beam tool is one of:
   a position of the sample along a primary optical axis of the charged-particle beam tool, relative to a plane of focus of the charged-particle beam tool,
   an amount of beam shaping applied to the charged-particle beam,
   an average landing energy of a plurality of charged particles in the charged-particle beam, or
   any combination thereof.

11. The method of claim 1, further comprising removing or reducing the aberrations in at least one image of the sample obtained by the charged-particle beam tool based on the final aberration parameter.

12. A method of determining a setting of a charged-particle beam tool, the method comprising:

performing an aberration determination method two or more times, each time based on a different estimate for the setting of the charged-particle beam tool, wherein the aberration determination method comprises:
a) obtaining two or more images of a sample using the charged-particle beam tool, wherein each image is obtained at a known relative difference in a measurement condition of the charged-particle beam tool;
b) selecting an estimated aberration parameter for the aberrations of a probe profile representing the charged-particle beam used by the charged-particle beam tool;
c) evaluating an error function indicative of the difference between the two or more images and two or more estimated images that are a function of the estimated aberration parameter and the known relative difference in the measurement condition;
d) updating the estimated aberration parameter;
e) performing processes c) and d) iteratively; and
f) determining the final aberration parameter as the estimated aberration parameter that provides the smallest value of the error function;
determining a residual error for each estimate of the setting by evaluating the error function based on the final aberration parameter determined for the respective estimate of the setting; and
determining as the setting of the charged-particle beam tool the estimate of the setting resulting in the smallest residual error.

13. The method of claim 1, wherein the measurement condition of the charged-particle beam tool is an amount of astigmatism applied to the charged-particle beam.

14. A method of determining aberrations in images obtained by a multi-beam charged-particle beam tool, the method comprising:
performing an aberration determination method for a first beamlet of the multi-beam charged-particle tool, wherein the aberration determination method comprises:
a) obtaining two or more images of a sample using the charged-particle beam tool, wherein each image is obtained at a known relative difference in a measurement condition of the charged-particle beam tool;
b) selecting an estimated aberration parameter for the aberrations of a probe profile representing the charged-particle beam used by the charged-particle beam tool;
c) evaluating an error function indicative of the difference between the two or more images and two or more estimated images that are a function of the estimated aberration parameter and the known relative difference in the measurement condition;
d) updating the estimated aberration parameter;
e) performing processes c) and d) iteratively; and
f) determining the final aberration parameter as the estimated aberration parameter that provides the smallest value of the error function,
wherein the estimated aberration parameter comprises a plurality of estimated aberration values, thereby determining a final aberration parameter comprising a plurality of final aberration values for the first beamlet; and
performing the aberration determination method for each of one or more further beamlets of the multi-beam charged-particle tool,
wherein, for the aberration determination method for each of one or more further beamlets of the multi-beam charged-particle tool, selecting the estimated aberration parameter comprises selecting one or more final aberration values determined for the first beamlet as corresponding one or more estimated aberration values for each one or more further beamlet, and
wherein, for the aberration determination method for each of one or more further beamlets of the multi-beam charged-particle tool, updating the estimated aberration parameter comprises updating estimated aberration values that do not correspond to the one or more estimated aberration values that were selected to correspond to the one or more final aberration values determined for the first beamlet.

15. The method of claim 14, wherein when performing the method for each one or more further beamlet of the multi-beam charged-particle tool,
the selecting the estimated aberration parameter comprises selecting one or more higher order final aberration values determined for the first beamlet as corresponding one or more higher order estimated aberration values for each one or more further beamlet, and
the updating the estimated aberration parameter comprises updating one or more lower order estimated aberration values that do not correspond to the one or more higher order estimated aberration values that were selected to correspond to the one or more higher order final aberration values determined for the first beamlet.

16. A charged-particle beam tool comprising:
an illumination system configured to generate a charged-particle beam and to scan the charged-particle beam across a sample;
a detection system configured to capture charged particles interacting with the sample, thereby creating an image of the sample; and
a controller configured to perform the method of claim 1.

17. The charged-particle beam tool of claim 16, wherein the illumination system further comprises an astigmatism compensator configured to adjust an amount of astigmatism applied to the charged-particle beam, and wherein the measurement condition of the charged-particle beam tool is the amount of astigmatism applied to the charged-particle beam.

* * * * *